United States Patent
D'Onofrio

(10) Patent No.: US 9,686,887 B2
(45) Date of Patent: Jun. 20, 2017

(54) LIQUID COOLED METAL CORE PRINTED CIRCUIT BOARD

(71) Applicant: Nicholas Michael D'Onofrio, Denver, CO (US)

(72) Inventor: Nicholas Michael D'Onofrio, Denver, CO (US)

(*) Notice: Subject to any disclaimer, the term of this patent is extended or adjusted under 35 U.S.C. 154(b) by 0 days.

(21) Appl. No.: 14/854,402

(22) Filed: Sep. 15, 2015

(65) Prior Publication Data

US 2016/0081178 A1    Mar. 17, 2016

Related U.S. Application Data

(60) Provisional application No. 62/050,488, filed on Sep. 15, 2014, provisional application No. 62/051,383, filed on Sep. 17, 2014.

(51) Int. Cl.
*H05K 7/20* (2006.01)
*H05K 1/05* (2006.01)
(Continued)

(52) U.S. Cl.
CPC ....... *H05K 7/20218* (2013.01); *H05K 1/0209* (2013.01); *H05K 1/05* (2013.01);
(Continued)

(58) Field of Classification Search
CPC .. H05K 2/20; H05K 7/20309; H05K 7/20272; H05K 7/20509; H05K 7/20927;
(Continued)

(56) References Cited

U.S. PATENT DOCUMENTS

| 3,524,497 A | 8/1970 | Chu et al. |
| 4,730,665 A | 3/1988 | Cutchaw |

(Continued)

FOREIGN PATENT DOCUMENTS

| CN | 201568933 U | * | 9/2010 | ............. F21V 29/00 |
| DE | 102009010256 A1 | * | 8/2010 | ........... H01L 23/467 |

(Continued)

OTHER PUBLICATIONS

Pechi, Lou, Liquid Cooling Is Coming to Chips and Boards, www.powerelectronics.com, Mar. 26, 2008, 2 pgs, http://powerelectronics.com/print/termal-management/liquid-cooling-coming-chips-and-boards [date retrieved Dec. 12, 2015].

(Continued)

*Primary Examiner* — Adam B Dravininkas
(74) *Attorney, Agent, or Firm* — Baker & Hostetler LLP

(57) ABSTRACT

The present disclosure further contemplates a system and method that cools metal core printed circuit boards by circulating a liquid coolant so that it contacts the base metal of the metal core printed circuit board. In one example the present disclosure contemplates a direct liquid cooled MCPCB system that may include a liquid cavity creating component coupled to the base plate of a MCPCB allowing a liquid coolant to come into contact with the base plate of the MCPCB for cooling of the MCPCB. The direct liquid cooled MCPCB system may minimize thermal bottlenecks between the electrical components and the cooling fluid while reducing the number of components required in previous liquid cooled electronics systems.

16 Claims, 5 Drawing Sheets

(51) Int. Cl.
  *H05K 1/02* (2006.01)
  *H05K 3/00* (2006.01)
(52) U.S. Cl.
  CPC ..... *H05K 3/0061* (2013.01); *H05K 2201/064* (2013.01); *H05K 2201/10409* (2013.01); *H05K 2201/10969* (2013.01)
(58) Field of Classification Search
  CPC ..... H05K 1/0203; H01L 23/34; H01L 23/467; H01L 23/473; G06F 1/20; F28D 15/00; F21V 29/006; F21V 15/011; F21V 29/2231
  USPC ..... 361/679.46, 679.53, 698, 699, 702, 707, 361/705, 715, 719; 165/80.2, 80.4, 80.5, 165/104.33, 166, 185, 908; 174/15.1, 174/16.3, 520; 257/714; 362/294, 362/249.02
  See application file for complete search history.

(56) References Cited

U.S. PATENT DOCUMENTS

| | | | |
|---|---|---|---|
| 4,783,721 A | 11/1988 | Yamamoto et al. | |
| 4,921,041 A | 5/1990 | Akachi | |
| 4,942,497 A | 7/1990 | Mine et al. | |
| 5,262,921 A * | 11/1993 | Lamers | H05K 7/20254 165/104.33 |
| 5,285,351 A | 2/1994 | Ikeda | |
| 5,343,360 A | 8/1994 | Sanwo | |
| 5,402,004 A | 3/1995 | Ozmat | |
| 5,761,035 A * | 6/1998 | Beise | H01L 23/4735 165/80.4 |
| 6,400,012 B1 * | 6/2002 | Miller | H01L 23/473 257/712 |
| 6,411,512 B1 | 6/2002 | Mankaruse et al. | |
| 6,594,149 B2 * | 7/2003 | Yamada | H05K 7/20872 165/170 |
| 6,729,383 B1 * | 5/2004 | Cannell | F28F 3/022 165/185 |
| 6,942,019 B2 | 9/2005 | Pikovsky et al. | |
| 6,992,887 B2 | 1/2006 | Jairazbhoy et al. | |
| 7,069,737 B2 | 7/2006 | Wang et al. | |
| 7,119,284 B2 * | 10/2006 | Bel | H05K 1/0272 165/80.4 |
| 7,190,581 B1 * | 3/2007 | Hassani | H01L 23/3677 165/80.3 |
| 7,414,845 B2 | 8/2008 | Attesey et al. | |
| 7,505,268 B2 | 3/2009 | Schick | |
| 7,551,439 B2 | 6/2009 | Peugh et al. | |
| 7,755,186 B2 | 7/2010 | Chiu et al. | |
| 7,901,191 B1 | 3/2011 | Odar et al. | |
| 8,169,779 B2 * | 5/2012 | Le | H01L 23/4735 165/104.33 |
| 8,587,019 B2 | 11/2013 | Yan et al. | |
| 8,662,712 B2 * | 3/2014 | Kraus | F21V 3/02 362/249.02 |
| 8,783,910 B2 * | 7/2014 | Hua | F21V 23/02 362/249.02 |
| 2002/0162673 A1 * | 11/2002 | Cook | H05K 7/20872 174/391 |
| 2005/0041428 A1 * | 2/2005 | Zhang | F21K 9/00 362/294 |
| 2006/0005953 A1 | 1/2006 | Lee et al. | |
| 2006/0028806 A1 * | 2/2006 | Parkhill | H01L 25/072 361/775 |
| 2006/0108098 A1 * | 5/2006 | Stevanovic | H01L 23/473 165/80.4 |
| 2007/0107873 A1 | 5/2007 | Peng | |
| 2008/0219007 A1 | 9/2008 | Heffington et al. | |
| 2010/0225219 A1 * | 9/2010 | Hua | F21V 23/02 313/46 |
| 2010/0321893 A1 | 12/2010 | Andrews | |
| 2011/0240260 A1 * | 10/2011 | Van Der Tempel | F21V 29/02 165/80.2 |
| 2011/0261563 A1 | 10/2011 | Li | |
| 2013/0141940 A1 | 6/2013 | Wu | |
| 2014/0015397 A1 | 1/2014 | Chen | |
| 2014/0090825 A1 * | 4/2014 | Chiang | F28F 3/12 165/170 |

FOREIGN PATENT DOCUMENTS

| | | | | |
|---|---|---|---|---|
| JP | 2002026469 A * | 1/2002 | ............... | H05K 7/20 |
| JP | 004385358 B2 * | 12/2009 | ........... | H01L 23/473 |

OTHER PUBLICATIONS

CeramCool Liquid Cooling brochure, CeramTec GmbH, 2 pgs., provided by client on Sep. 8, 2015, printed in Lorenz, Germany.
Water-Chilled Climate Control Systems, www.surna.com, 5 pgs., http://surna.com/ [date retrieved Dec. 12, 2015].
Liquid-Filled LED Bulbs: 360 Degree Light, Metaefficient, 15 pgs., http://www.metaefficient.com/leds/liquidfilled-led-light-bulbs-360-degrees-light.html [date retrieved Dec. 12, 2015].
Liquid Immersion Cooling for Data Centers, www.grcooling.com, 5 pgs., http://www.grcooling.com/ [date retrieved Dec. 12, 2015].
CPU Coolers, corsair.com, 8 pgs., http://www.corsair.com/en-us/cooling[date retrieved Dec. 12, 2015].
International Search Report and Written Opinion, from PCT/2015/050147 with an international filing date of Sep. 15, 2015, mailed Jan. 15, 2016, International Searching Authority of WIPO, Alexandria, VA, US.

* cited by examiner

LIQUID COOLED METAL CORE PRINTED CIRCUIT BOARD

RELATED APPLICATIONS

This application claims priority under 35 U.S.C. §119 based on U.S. Provisional Application No. 62/050,488, filed on Sep. 15, 2014 and U.S. Provisional Application No. 62/051,383, filed on Sep. 17, 2014. The disclosure of both U.S. Provisional Application No. 62/050,488 and U.S. Provisional Application No. 62/051,383 are incorporated herein by reference.

FIELD OF INVENTION

The present disclosure contemplates a system and apparatus that cools metal core printed circuit boards. The present disclosure further contemplates a system and method that cools metal core printed circuit boards by circulating a liquid coolant so that it contacts the base metal of the metal core printed circuit board.

BACKGROUND

There have been a number of advancements in the field of thermal management for electronic circuit boards. One innovation has been the Metal Core Printed Circuit Board ("MCPCB"). This approach utilizes a layer of thermal conductive metal, such as copper or aluminum, as the base plate for the circuit board construction. The circuits and components are electrically isolated from the base plate by a thin dielectric layer. The close proximity of the base plate to the electronic circuits and electronic components allows the heat to be dissipated from the source more effectively.

Improvement to the MCPCB approach has included using raised areas on the base plate to protrude through the dielectric layer, providing more thermal attachment options with electronic components, such as soldering or welding. Additional improvements include utilizing thermal transfer vias, made of metals such as copper or aluminum, that allow the transfer of heat through multiple circuit board layers on a single MCPCB.

MCPCBs require effective thermal management systems for the removal of heat from the base plate. Current liquid cooling systems are designed as self-contained cold plates or heat pipes that are attached to circuit boards or electronic components with methods such as soldering, thermal pastes, thermal adhesives, and mechanical systems. Unfortunately, these conventional systems introduce additional material layers between the thermal transfer fluid and circuit board, which can increase thermal resistance and act as a thermal bottleneck.

SUMMARY OF INVENTION

In one example the present disclosure contemplates a direct liquid cooled MCPCB system that may include a liquid cavity creating component coupled to the base plate of a MCPCB. The direct liquid cooled MCPCB system may cool a MCPCB by coupled to one or more liquid cavity creating components to at least one surface of the MCPCB base plate, allowing a liquid coolant to come into contact with the base plate of the MCPCB for cooling of the MCPCB. The direct liquid cooled MCPCB system may minimize thermal bottlenecks between the electrical components and the cooling fluid while reducing the number of components required in previous liquid cooled electronics systems. This may result in increased thermal dissipation rates, higher possible input temperatures for cooling fluids, lower energy consumption, simplified production methods, and lower production costs.

In some examples, the present disclosure contemplates a direct liquid cooled MCPCB system that may include a liquid cavity creating component and a fastening mechanism(s). The liquid cavity creating component may serve as a heat pipe allowing liquid coolant to flow in a self-contained system or the liquid cavity creating component may have ports to allow liquid coolant to flow into and out of the direct liquid cooled MCPCB system. In the direct liquid cooled MCPCB system, the liquid cavity creating component may be coupled to the MCPCB using the fastening mechanisms. In some example direct liquid cooled MCPCB systems, the liquid cavity creating component may be coupled to a MCPCB cover and the MCPCB cover may be coupled to the MCPCB using another fastening mechanism. In another example the liquid cavity creating component, the MCPCB cover, and the MCPCB may all be coupled together using only the first fastening mechanism. In some examples where ports are utilized in the direct liquid cooled MCPCB system, the liquid cavity creating component may have a multiple liquid ports, where a liquid coolant may flow into the liquid cavity creating component through one liquid port and the liquid coolant may flow out of the liquid cavity creating component through another liquid port. In some examples, the liquid cavity creating component may have an integrated external thermal interface for removing excess heat from the base plate of the MCPCB, while also absorbing or radiating heat from or to the area surrounding the system.

In another example the present disclosure contemplates a method for direct cooling of a MCPCB including coupling a liquid cavity creating component to a MCPCB and circulating a liquid coolant through a cavity between the liquid cavity creating component and the base plate of the MCPCB, such that the liquid coolant comes into direct contact with the base plate of the MCPCB. Example methods for direct cooling of a MCPCB may use a self-contained heat pipe to directly cool the base plate of the MCPCB or the method for direct cooling of a MCPCB may use port(s) to circulate the liquid coolant in the cavity between the liquid cavity creating component and the base plate of the MCPCB.

BRIEF DESCRIPTION OF THE DRAWINGS

The foregoing and other features of the present disclosure will become more fully apparent from the following description, taken in conjunction with the accompanying drawings. Understanding that these drawings depict only several examples in accordance with the disclosure and are therefore, not to be considered limiting of its scope, the disclosure will be described with additional specificity and detail through use of the accompanying drawings.

In the drawings.

DETAILED DESCRIPTION

Figure 1:
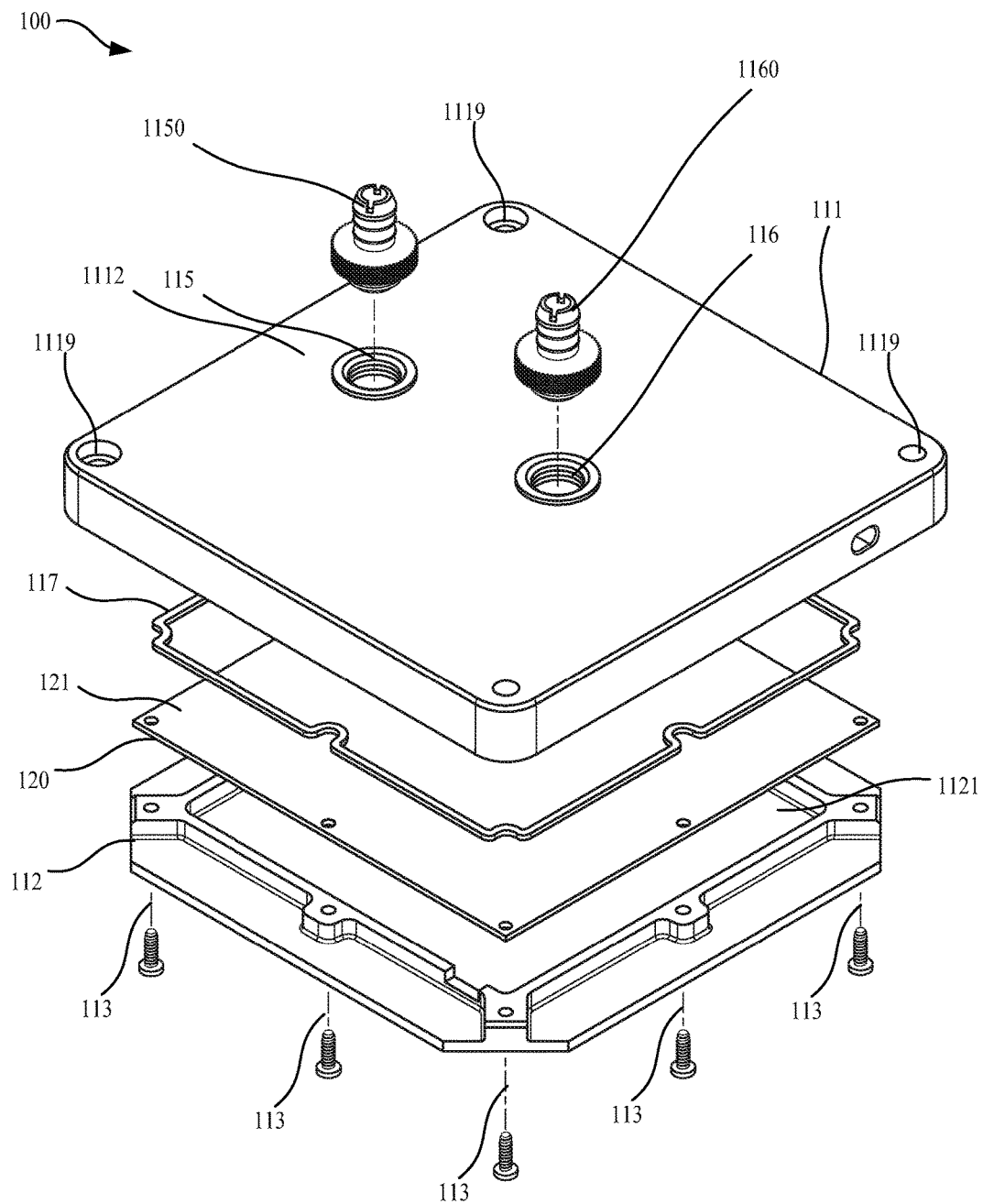
FIG. 1 depicts an exploded view of an example direct liquid cooled MCPCB system.

In the following detailed description, reference is made to the accompanying drawings, which form a part hereof. In the drawings, similar symbols typically identify similar components, unless context dictates otherwise. The illustrative examples described herein are not meant to be limiting. Other examples may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

Figure 2:
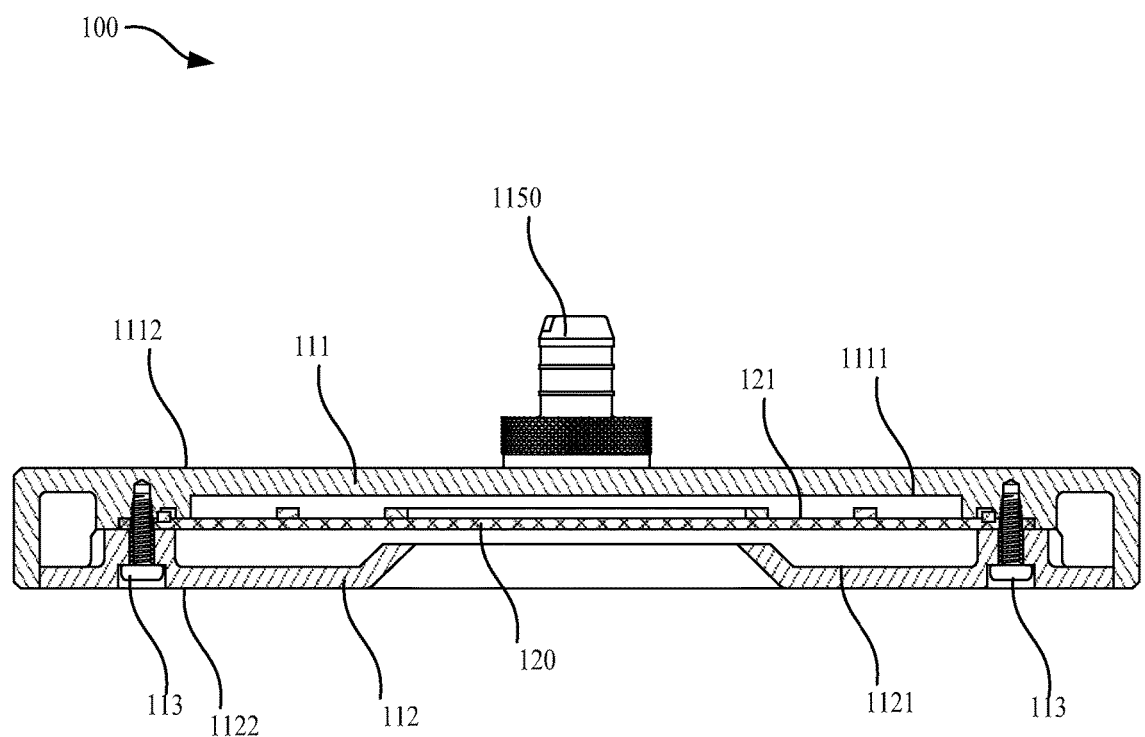
FIG. 2 depicts a cross-sectional side view of an example direct liquid cooled MCPCB system.

Turning to the figures in detail, FIG. 1 and FIG. 2 depict an example direct liquid cooled MCPCB system 100. The direct liquid cooled MCPCB system 100 may be comprised of a liquid cavity creating component 111, a MCPCB cover 112, a fastening mechanism(s) 113, a liquid port 115, a liquid port 116, and a MCPCB 120. The MCPCB 120 in the example direct liquid cooled MCPCB system 100 may include a circuit board combined with a base plate 121. In the direct liquid cooled MCPCB system 100, the liquid cavity creating component 111 may be coupled to the MCPCB cover 112 and the MCPCB 120 using a fastening mechanism 113. In some examples, while the liquid cavity creating component 111 is coupled to the MCPCB cover 112 using the fastening mechanism 113, the MCPCB cover 112 may have a second fastening mechanism for attachment to a MCPCB 120. The liquid cavity creating component 111 may have an external fastening mechanism 1119 on the exterior surface of the liquid cavity creating component 1112. The external fastening mechanism 1119 may attach the direct liquid cooled MCPCB system 100 to surrounding structures, for example shelving for indoor farming or server farms.

In the direct liquid cooled MCPCB system 100, the liquid cavity creating component 111 may have liquid ports 115, 116. The liquid coolant may flow into the liquid cavity creating component 111 through one liquid port 115 and the liquid coolant may flow out of the liquid cavity creating component 111 through another liquid port 116. When using liquid ports 115, 116 in the liquid cavity creating component 111, the direct liquid cooled MCPCB system 100 may remove heat generated by a MCPCB 120 by one or more surfaces of the base plate 121 as a direct contact area for liquid coolant. The containment of liquid coolant may be managed by one or more liquid cavity creating component 111 that interface with the base plate 121 of the MCPCB 120 where the interior surface of the liquid cavity creating component 1111 forms sealed cavity with base plate 121 of the MCPCB 120. The sealed cavity may be formed using a gasket 117, where the gasket may be coupled to the base plate 121 of the MCPCB 120 and also coupled to the liquid cavity creating component 111. The liquid cavity creating component 111 may form a self-contained system, such as a heat pipe, or may be designed with one or more liquid ports, for example the liquid port 115 and the liquid port 116 shown in FIG. 1, to allow for the inlet and outlet of liquid coolant or gas coolant in an open or closed loop system.

In some examples, the direct liquid cooled MCPCB system may use a self-contained heat pipe design where the liquid coolant circulates through the liquid cavity between the liquid cavity creating component 111 and the base plate 121 of the MCPCB 120 using known methods such as, but not limited to, gravity, capillary pressure, or a mechanical agitator. In the example direct liquid cooled MCPCB system with the self-contained heat pipe design there are no inlet or outlet ports in the liquid cavity creating component 111.

Figure 3:
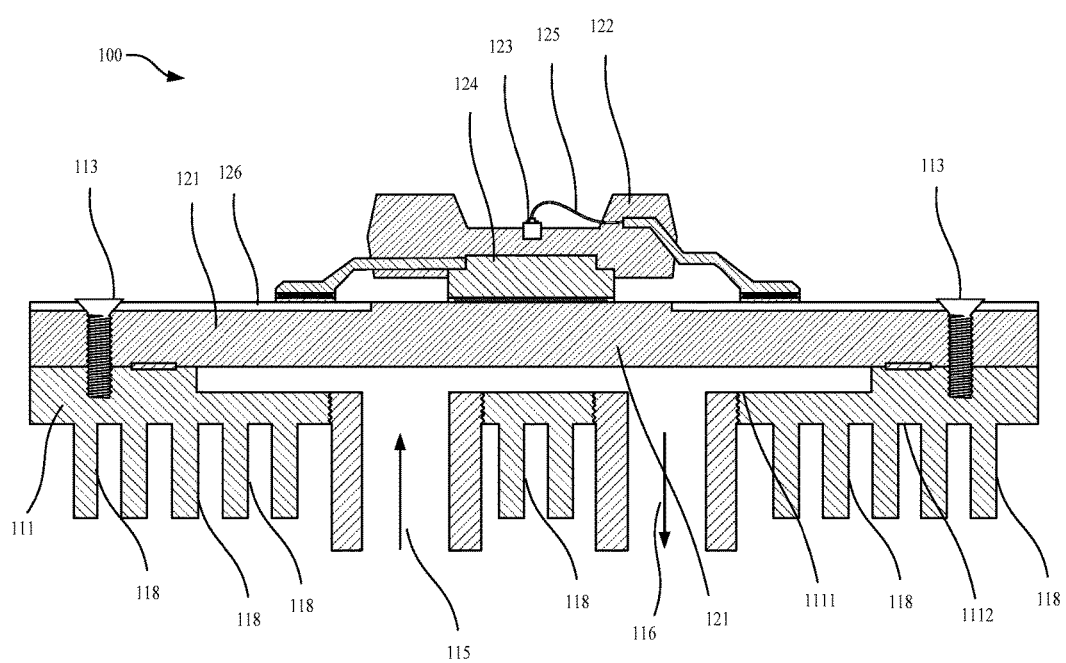
FIG. 3 depicts a cross-sectional side view of an example direct liquid cooled MCPCB system with an extended external thermal interface.

The liquid cavity creating component 111 may be made of any thermally conductive material, such as aluminum or copper. The liquid cavity creating component 111 and the MCPCB cover 112 may be manufactured using many methods including but not limited to extrusion, machining, photochemical etching, molding, three-dimensional printing, and laser etching. The fastening mechanism 113 and other fastening mechanisms may vary among many methods, including but not limited to adhesives, soldering, ultrasonic welding, laser welding, and mechanical systems as depicted in FIGS. 1-3. The direct liquid cooled MCPCB system 100 may use any type of liquid coolant, including but not limited to water, deionized water, glycols, Betaine, Halomethanes, and/or dielectric fluid. The direct liquid cooled MCPCB system 100 may use gas coolants in conjunction with the liquid coolant. The interior surface of the liquid cavity creating component 1111, the exterior surface of the liquid cavity creating component 1112, the base plate of the MCPCB 121, the interior surface of the MCPCB cover 1121, and the exterior surface of the MCPCB cover 1122 may have any number of features that benefit performance, functionality, or manufacturing. These features include but are not limited to textured surfaces, channels, protrusions, fins, thermal coatings, corrosion resistant coatings, tubing, tubing connectors, tubing locks, gaskets, and electrical connections.

Figure 4:
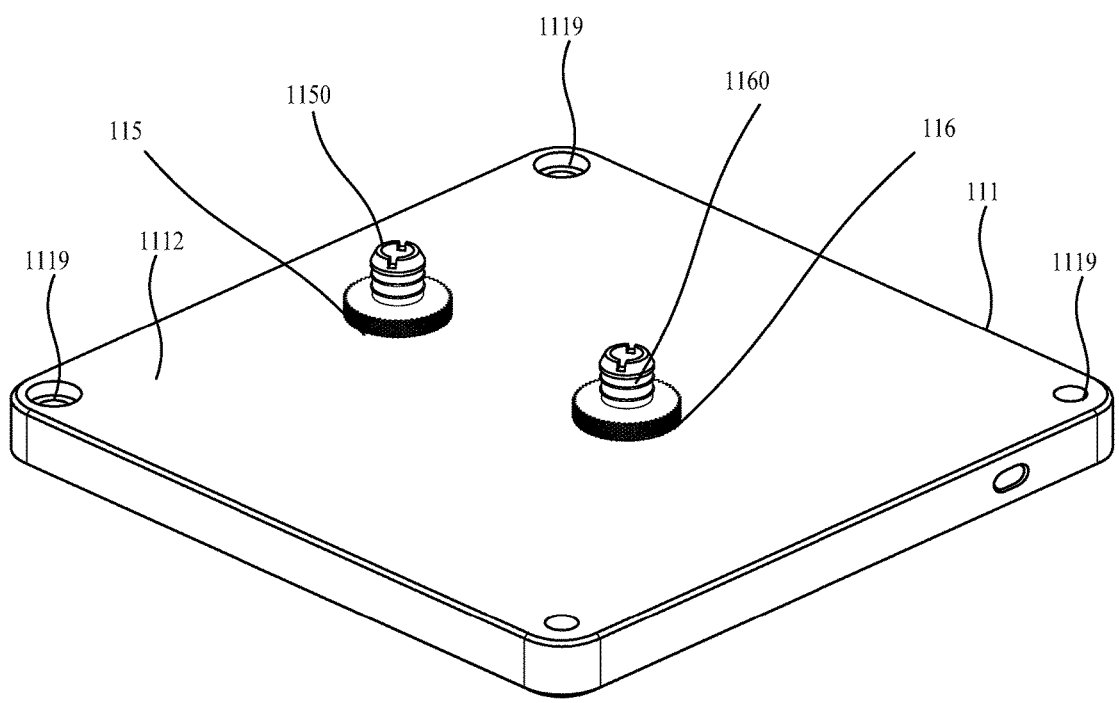
FIG. 4 depicts a side perspective view of an example liquid cavity creating component for the direct liquid cooled MCPCB system.

The ports in the liquid cavity creating component 111, such as liquid ports 115, 116 shown in FIG. 1 and FIG. 4, may interface with hose attachments 1150, 1160 as shown in FIGS. 1 and 4. The interface between the liquid ports 115, 116 in the liquid cavity creating component 111 and the hose attachments 1150, 1160 may be sealed using known methods, such as, but not limited to an O-ring. The hose attachments 1150, 1160 depicted and any other hose attachments may interface with the liquid cavity creating component using any know attachment method, such as, but not limited to, adhesives, soldering, ultrasonic welding, laser welding, and mechanical systems.

The direct liquid cooled MCPCB system 100 may also integrate an external thermal interface 118 with the liquid cavity creating component 111 as shown in FIG. 3. The external thermal interface 118 may include features on the exterior surface of the liquid cavity creating component 1112 that increase the exterior surface area of the liquid cavity creating component 111, improving thermal transfer rates with the surrounding area. These features include but are not limited to surface textures, holes, fins, rods, and wings. The external thermal interface 118 may be a feature of the same piece the liquid cavity creating component 111 is made from as shown in FIG. 3. However, in some examples, the external thermal interface 118 may be a component that is attached to the liquid cavity creating component 111 by methods including but not limited to adhesives, soldering, three-dimensional printing, ultrasonic welding, laser welding, and mechanical systems. Example methods to produce the external thermal interface 118 include but are not limited to extrusion, machining, laser cutting, liquid cutting, molding, and stamping. The external thermal interface 118 may be made of high thermal conducting solids, such as aluminum, copper, or ceramic.

Depending on the external surface temperature of the system, the external thermal interface 118 may cause the temperature of the surrounding area to increase or decrease. If the external surface temperature of the direct liquid cooled MCPCB system 100 is below the surrounding area temperature, for example, the external thermal interface 118 will absorb heat from the surrounding area. If the external surface temperature of the direct liquid cooled MCPCB system 100 is above the surrounding area temperature, the external thermal interface 118 will radiate heat to the surrounding area. The rate of thermal transfer may be increased by utilizing a larger number of external thermal interface 118, a larger sized external thermal interface 118, or both, in order it increase surface area. The rate of thermal transfer may also be increased through the use of one or more fluid movers, such as but not limited to fans, pumps, sprayers, and propellers.

As shown in FIG. 3 the liquid cavity creating component 111 of the direct liquid cooled MCPCB system 100 may lack a MCPCB cover 112 and the liquid cavity creating component 111 may be coupled directly to the MCPCB 120 using a MCPCB fastening means 119. The base plate 121 of the MCPCB 120 and the interior surface of liquid cavity creating component 1111 form the liquid cavity for the liquid coolant. The liquid coolant may flow in and out of the liquid cavity creating component 111 through liquid ports 115, 116. A gasket or other known sealing means may be used to seal the cavity formed between the base plate 121 of the MCPCB 120 and the interior surface of liquid cavity creating component 1111.

As shown in FIG. 3, many kinds of MCPCB 120 may be used in the direct liquid cooled MCPCB system 100 and the MCPCB 120 may have many configurations. FIG. 3 depicts a MCPCB that includes a light emitting diode (LED) 123, LED housing 122, a LED heat sink 124, an LED bond wire 125, and a dielectric layer 126.

The internal temperature of the direct liquid cooled MCPCB system 100 may be controlled through means including but not limited to liquid coolant flow rate, input liquid coolant temperature, type of liquid coolant in the system, and power consumption of the electronic components. The temperatures within the direct liquid cooled MCPCB system 100 and the surrounding area may be monitored and controlled through a number of devices, including but not limited to thermostats, thermometers, gauges, flow controllers, electronic processors, and heat exchangers. The temperature monitoring and controlling devices may be included as devices within or attached to the direct liquid cooled MCPCB system 100, or independently located. In addition to the benefit of dual temperature control for electronic devices and their surrounding areas, some examples may reduce the number of total components needed to accomplish both tasks, simplifies the manufacturing process, reduces thermal bottlenecks, lowers the total cost of production, and reduces energy consumption.

Figure 5:
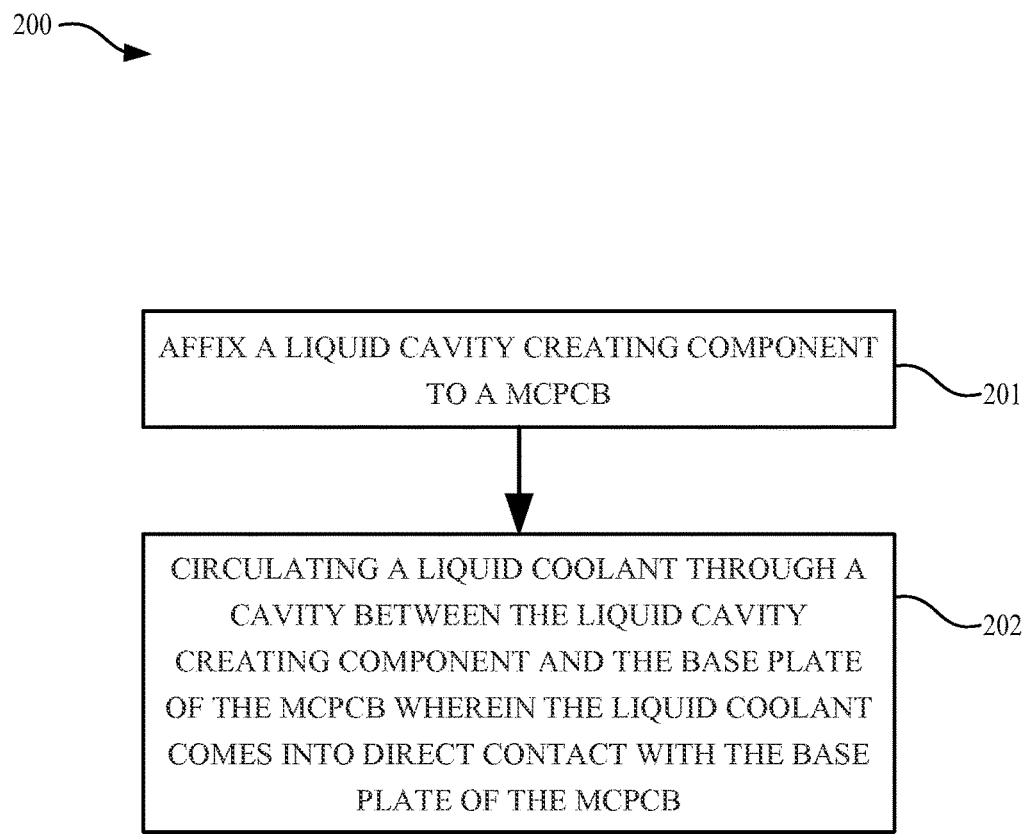
FIG. 5 depicts an example method for direct cooling of a MCPCB.

FIG. 5 depicts an example method for direct cooling of a MCPCB 200. The method for direct cooling of a MCPCB 200 may include coupling a liquid cavity creating component to a MCPCB 201 and circulating a liquid coolant through a cavity between the liquid cavity creating component and the base plate of the MCPCB 202. The method for direct cooling of a MCPCB allows the liquid coolant to come into contact with the base plate of the MCPCB 202. The method for direct cooling of a MCPCB 200 may use a self-contained heat pipe to directly cool the base plate 121 of the MCPCB 120 or the method for direct cooling of a MCPCB 200 may use a ports to circulate the liquid coolant in the cavity between the liquid cavity creating component 111 and the base plate 121 of the MCPCB 120.

While various aspects and examples have been disclosed herein, other aspects and examples will be apparent to those skilled in the art. The various aspects and examples disclosed herein are for purposes of illustration and are not intended to be limiting.

What is claimed is:

1. A direct liquid cooled metal core printed circuit board system comprising:
    a liquid cavity creating component having an interior surface and an exterior surface, wherein the liquid cavity creating component is coupled to a base plate of a metal core printed circuit board by a first fastening mechanism to form a cavity between the interior surface of the liquid cavity creating component and the base plate of the metal core printed circuit board;
    wherein an entirety of the exterior surface of the liquid cavity creating component interfaces directly with the ambient environment; and
    wherein the exterior surface of the liquid cavity creating component includes an external thermal interface.

2. The direct liquid cooled metal core printed circuit board system of claim 1, wherein the liquid cavity creating component and the base plate of the metal core printed circuit board are the same material.

3. The direct liquid cooled metal core printed circuit board system of claim 1, wherein the liquid cavity creating component is aluminum.

4. The direct liquid cooled metal core printed circuit board system of claim 1, wherein a light emitting diode is operatively coupled to the metal core printed circuit board.

5. The direct liquid cooled metal core printed circuit board system of claim 4, wherein the exterior surface of the liquid cavity creating component includes at least one external thermal interface.

6. The direct liquid cooled metal core printed circuit board system of claim 1, further comprising:
    a metal core printed circuit board cover; and
    a second fastening mechanism coupling the metal core printed circuit board cover to the metal core printed circuit board.

7. The direct liquid cooled metal core printed circuit board system of claim 1, further comprising:
    a first liquid port and a second liquid port located in the liquid cavity creating component, wherein the liquid coolant enters the liquid cavity through the first liquid port and exits the liquid cavity through the second liquid port.

8. The direct liquid cooled metal core printed circuit board system of claim 7, wherein the exterior surface of the liquid cavity creating component includes at least one external thermal interface.

9. The direct liquid cooled metal core printed circuit board system of claim 7, wherein the liquid cavity creating component is made of the same material as the base plate of the metal core printed circuit board.

10. The direct liquid cooled metal core printed circuit board system of claim 7, wherein the liquid cavity creating component is made of aluminum.

11. A direct liquid cooled metal core printed circuit board system comprising:
    a liquid cavity creating component having an interior surface and an exterior surface, wherein the liquid cavity creating component is coupled to a base plate of a metal core printed circuit board by a first fastening mechanism to form a cavity between the interior surface of the liquid cavity creating component and the base plate of the metal core print circuit board;

wherein the liquid cavity creating component includes an external fastening mechanism.

12. A direct liquid cooled metal core printed circuit board system comprising:
- a liquid cavity creating component having an interior surface and an exterior surface, wherein the liquid cavity creating component is coupled to a base plate of a metal core printed circuit board by a first fastening mechanism to form a cavity between the interior surface of the liquid cavity creating component and the base plate of the metal core print circuit board;
- wherein an entirety of the exterior surface of the liquid cavity creating component interfaces directly with the ambient environment;
- wherein a light emitting diode is operatively coupled to the metal core printed circuit board; and
- wherein the liquid cavity creating component is made of the same material as the base plate of the metal core printed circuit board.

13. A direct liquid cooled metal core printed circuit board system comprising:
- a liquid cavity creating component having an interior surface and an exterior surface, wherein the liquid cavity creating component is coupled to a base plate of a metal core printed circuit board by a first fastening mechanism to form a cavity between the interior surface of the liquid cavity creating component and the base plate of the metal core print circuit board;
- wherein an entirety of the exterior surface of the liquid cavity creating component interfaces directly with the ambient environment;
- wherein a light emitting diode is operatively coupled to the metal core printed circuit board; and
- wherein the liquid cavity creating component is aluminum.

14. A direct liquid cooled metal core printed circuit board system comprising:
- a liquid cavity creating component having an interior surface and an exterior surface, wherein the liquid cavity creating component is coupled to a base plate of a metal core printed circuit board by a first fastening mechanism to form a cavity between the interior surface of the liquid cavity creating component and the base plate of the metal core print circuit board;
- a first liquid port and a second liquid port located in the liquid cavity creating component, wherein the liquid coolant enters the liquid cavity through the first liquid port and exits the liquid cavity through the second liquid port;
- a metal core printed circuit board cover; and
- a second fastening mechanism coupling the metal core printed circuit board cover to the metal core printed circuit board.

15. A direct liquid cooled metal core printed circuit board system comprising:
- a liquid cavity creating component having an interior surface and an exterior surface, wherein the liquid cavity creating component is coupled to a base plate of a metal core printed circuit board by a first fastening mechanism to form a cavity between the interior surface of the liquid cavity creating component and the base plate of the metal core print circuit board;
- a first liquid port and a second liquid port located in the liquid cavity creating component, wherein the liquid coolant enters the liquid cavity through the first liquid port and exits the liquid cavity through the second liquid port;
- a metal core printed circuit board cover; and
- a second fastening mechanism coupling the metal core printed circuit board cover to the metal core printed circuit board;
- wherein the exterior surface of the liquid cavity creating component includes at least one external thermal interface.

16. A method for direct cooling of a metal core printed circuit board, the method comprising:
- coupling a liquid cavity creating component having an exterior surface to a metal core printed circuit board; and
- introducing a liquid coolant into a liquid cavity formed between the liquid cavity creating component and a base plate of the metal core printed circuit board, allowing the liquid coolant to directly contact the base plate of the metal core printed circuit board;
- wherein an entirety of the exterior surface of the liquid cavity creating component interfaces directly with the ambient environment; and
- wherein the exterior surface of the liquid cavity creating component includes an external thermal interface.

* * * * *